US009097818B2

(12) United States Patent
Hursan

(10) Patent No.: US 9,097,818 B2
(45) Date of Patent: Aug. 4, 2015

(54) KEROGEN POROSITY VOLUME AND PORE SIZE DISTRIBUTION USING NMR

(75) Inventor: Gabor Hursan, Spring, TX (US)

(73) Assignee: BAKER HUGHES INCORPORATED, Houston, TX (US)

( * ) Notice: Subject to any disclaimer, the term of this patent is extended or adjusted under 35 U.S.C. 154(b) by 455 days.

(21) Appl. No.: 13/366,913

(22) Filed: Feb. 6, 2012

(65) Prior Publication Data

US 2013/0200890 A1 Aug. 8, 2013

(51) Int. Cl.
*G01V 3/32* (2006.01)
*G01R 33/38* (2006.01)

(52) U.S. Cl.
CPC .............. *G01V 3/32* (2013.01); *G01R 33/3808* (2013.01)

(58) Field of Classification Search
CPC ............................. G01V 3/32; G01R 33/3808
See application file for complete search history.

(56) References Cited

U.S. PATENT DOCUMENTS

| 6,215,304 | B1 | 4/2001 | Slade |
| 6,646,437 | B1 | 11/2003 | Chitale et al. |
| 6,769,497 | B2 | 8/2004 | Dubinsky et al. |
| 7,500,517 | B2 * | 3/2009 | Looney et al. ............ 166/250.01 |
| 7,789,164 | B2 * | 9/2010 | Looney et al. ............... 166/402 |
| 8,104,536 | B2 * | 1/2012 | Looney et al. ............ 166/250.01 |
| 8,165,817 | B2 * | 4/2012 | Betancourt et al. ............ 702/13 |
| 8,614,573 | B2 * | 12/2013 | Minh .......................... 324/303 |
| 2009/0254283 | A1 | 10/2009 | Jacobi et al. |
| 2010/0089575 | A1 | 4/2010 | Kaminsky et al. |
| 2010/0228485 | A1 | 9/2010 | Betancourt et al. |
| 2010/0270038 | A1 | 10/2010 | Looney et al. |
| 2011/0022320 | A1 | 1/2011 | Abousleiman et al. |
| 2011/0068788 | A1 | 3/2011 | Minh |

OTHER PUBLICATIONS

Prammer, M.G., et al., "Measurements of Clay-Bound Water and Total Porosity by Magnetic Resonance Logging," SPE 36522, SPE Annual Technical Conference, Denver, CO, pp. 311-320 (Oct. 1996).
Moss, A.K., "Shale Volume Estimates from NMR Core Data," Symposium of the Society of Core Analysts, SCA2003-66, Pau, France (Sep. 2003).
LeCompte, B., et al., "Defining Clay Type Using NMR and Geochemical Logging Measurements," SPWLA 49th Annual Logging Symposium, Scotland (May 2008).
Ambrose, R.A., et al., "New Pore-Scale Considerations for Shale Gas in Place Calculations," SPE 131772, SPE Unconventional Gas Conference, Pittsburgh, PA (Feb. 2010).

(Continued)

*Primary Examiner* — Dixomara Vargas
(74) *Attorney, Agent, or Firm* — Mossman Kumar & Tyler PC

(57) ABSTRACT

Method and apparatus for estimating a kerogen (organic) porosity of an earth formation. The method may include using at least one processor to estimate a kerogen porosity using NMR signals indicative to an inorganic porosity and NMR signals indicative of a total porosity for a volume of interest in an earth formation. The apparatus may include an NMR tool configured to acquire NMR signals indicative to an inorganic porosity and NMR signals indicative of a total porosity for a volume of interest in an earth formation.

15 Claims, 6 Drawing Sheets

(56) References Cited

OTHER PUBLICATIONS

Sondergeld, C.H., et al., "Petrophysical Considerations in Evaluating and Producing Shale Gas Resources," SPE 131768, SPE Unconventional Gas Conference, Pittsburgh, PA (Feb. 2010).

Passey, Q.R., et al., "From Oil-Prone Source Rock to Gas-Producing Shale Reservoir—Geologic and Petrophysical Characterization of Unconventional Shale-Gas Reservoirs," SPE 131350, SPE International Oil & Gas Conference and Exhibition, Beijing, CN (Jun. 2010).

* cited by examiner

KEROGEN POROSITY VOLUME AND PORE SIZE DISTRIBUTION USING NMR

BACKGROUND OF THE DISCLOSURE

1. Field of the Disclosure

The present disclosure relates generally to determining geological properties of subsurface formations using Nuclear Magnetic Resonance ("NMR") methods for logging boreholes, particularly for estimating kerogen porosity.

2. Description of the Related Art

A variety of techniques are currently utilized in determining the presence and estimation of quantities of hydrocarbons (oil and gas) in earth formations. These methods are designed to determine formation parameters, including among other things, the resistivity, porosity and permeability of the rock formation surrounding the borehole drilled for recovering the hydrocarbons. Typically, the tools designed to provide the desired information are used to log the borehole. Much of the logging is done after the well bores have been drilled. More recently, boreholes have been logged while drilling, which is referred to as measurement-while-drilling (MWD) or logging-while-drilling (LWD).

One commonly used technique involves utilizing Nuclear Magnetic Resonance (NMR) logging tools and methods for determining, among other things, porosity, hydrocarbon saturation and permeability of the rock formations. The NMR logging tools are utilized to excite the nuclei of the fluids in the geological formations surrounding the borehole so that certain parameters such as nuclear spin density, longitudinal relaxation time (generally referred to in the art as $T_1$) and transverse relaxation time (generally referred to as $T_2$) of the geological formations can be measured. From such measurements, porosity, permeability and hydrocarbon saturation are determined, which provides valuable information about the make-up of the geological formations and the amount of extractable hydrocarbons.

The NMR tools generate a static magnetic field in a region of interest surrounding the borehole. NMR is based on the fact that the nuclei of many elements have angular momentum (spin) and a magnetic moment. The nuclei have a characteristic Larmor resonant frequency related to the magnitude of the magnetic field in their locality. Over time the nuclear spins align themselves along an externally applied static magnetic field creating a macroscopic magnetization, in short: magnetization. This equilibrium situation can be disturbed by a pulse of an oscillating magnetic field, which tips the spins with resonant frequency within the bandwidth of the oscillating magnetic field away from the static field direction. The angle θ through which the spins exactly on resonance are tipped is given by the equation:

$$\theta = \gamma B_1 t_p / 2 \quad (1)$$

where γ is the gyromagnetic ratio, $B_1$ is the magnetic flux density amplitude of the sinusoidally oscillating field and $t_p$ is the duration of the RF pulse.

After tipping, the magnetization precesses around the static field at a particular frequency known as the Larmor frequency $\omega_0$ given by $$\omega_0 = \gamma B_0 \quad (2)$$

where $B_0$ is the static magnetic flux density. For hydrogen nuclei γ/2π=4258 Hz/Gauss, so that a static field of 235 Gauss would produce a precession frequency of 1 MHz. At the same time, the magnetization returns to the equilibrium direction (i.e., aligned with the static field) according to a characteristic recovery time known as the "spin-lattice relaxation time" or $T_1$. $T_1$ is controlled by the molecular environment and is typically one millisecond to several seconds in rocks.

At the end of a θ=90° tipping pulse, spins on resonance are pointed in a common direction perpendicular to the static field, and they precess at the Larmor frequency. However, because of inhomogeneity in the static field due to the constraints on tool shape, imperfect instrumentation, or microscopic material heterogeneities, each nuclear spin precesses at a slightly different rate. Hence, after a time long compared to the precession period, but shorter than $T_1$, the spins will no longer be precessing in phase. This de-phasing occurs with a time constant that is commonly referred to as $T_2^*$. Dephasing due to static field inhomogeneity can be recovered by generating spin echoes (see below). The remaining dephasing is characterized by the time constant $T_2$ and is due to properties of the material.

A receiving coil is designed so that a voltage is induced by the precessing spins. Only that component of the nuclear magnetization precesses that is orthogonal to the static magnetic field. The precessing component induces a signal in the receiving coil if its orientation is appropriate. After an 180° tipping pulse (an "inversion pulse"), the spins on resonance are aligned opposite to the static field and the magnetization relaxes along the static field axis to the equilibrium direction. Hence, a signal will be generated after a 90° tipping pulse, but not after a 180° tipping pulse in a generally uniform magnetic field.

While many different methods for measuring $T_1$ have been developed, a single standard known as the CPMG sequence (Carr-Purcell-Meiboom-Gill) for measuring $T_2$ has evolved. In contrast to laboratory NMR magnets, well logging tools have inhomogeneous magnetic fields due to the constraints on placing the magnets within a tubular tool and the inherent "inside-out" geometry. Maxwell's divergence theorem dictates that there cannot be a region of high homogeneity outside the tool. Therefore in typical well bores, $T_2^* \ll T_2$, and the free induction decay becomes a measurement of the apparatus-induced inhomogeneities. To measure the true $T_2$ in such situations, it is necessary to cancel the effect of the apparatus-induced inhomogeneities. To accomplish the same, a series of pulses is applied to repeatedly refocus the spin system, canceling the $T_2^*$ effects and forming a series of spin echoes. The decay of echo amplitude is a true measure of the decay due to material properties. Furthermore it can be shown that the decay is in fact composed of a number of different decay components forming a $T_2$ distribution. The echo decay data can be processed to reveal this distribution which is related to rock pore size distribution and other parameters of interest to the well log analyst.

Source rocks and reservoir rocks may have different porosity characteristics due to the mechanisms of their formations. The pore systems of both siliciclastic and carbonaceous reservoir rocks form in aqueous, oxic environments. When hydrocarbons invade these formations at a later stage, grain surfaces remain at least partially water-wet. Source rocks exhibit two major differences with respect to reservoir rocks. First, significant amounts of organic materials from algal, planktonic, or plant remains are preserved within fine sediments under anoxic conditions in stagnant depositional environments. Second, the chemical breakdown of organic material and the expulsion of volatile hydrocarbons during the maturation process create a secondary pore system within the remaining solid kerogen. The majority of this fine network of pore space, characterized by sub-micron size pores is isolated from the inorganic grains and the detrital porosity. Due to the hydrophobic nature of kerogen, the small size of the pores and excess pressure due to continual hydrocarbon generation the intrakerogen porosity is hydrocarbon wet and entirely filled with hydrocarbons.

The NMR signature of water-wet detrital porosity is similar to that of reservoir rocks. Water is capillary bound or clay-bound due to the fine pore sizes associated with the low energy deposition and clay minerals. The absence of movable water is also suggested by the minimal water cut from source rocks during completion and production. As a result, NMR relaxation of water is dominated by surface-fluid interaction. Hydrocarbons in detrital pores behave similarly to those in reservoir rocks—their NMR relaxation properties are controlled by bulk and/or diffusion effects. Overall, NMR properties of reservoir fluids in water-wet pore systems are well established both theoretically and experimentally.

Hydrocarbons enclosed within the intrakerogen porosity, on the other hand, are in direct contact with the pore surface, enhancing relaxation. Consequently, relaxation times become shorter. To date, there is no first principle quantitative derivation to quantify the surface relaxation between kerogen and hydrocarbons. Laboratory studies, however, suggest that the $T_2$ relaxation time of pressurized methane is on the order of 10 milliseconds. Thus, the NMR properties of light hydrocarbons associated with intrakerogen porosity are likely to overlap with those of bound water in water-wet pores. The present disclosure addresses the problem of estimating kerogen porosity.

SUMMARY OF THE DISCLOSURE

In aspects, the present disclosure is related to methods and apparatuses for determining geological properties of subsurface formations using NMR methods for logging boreholes, particularly for estimating kerogen porosity.

One embodiment according to the present disclosure includes a method of estimating a kerogen porosity of an earth formation, comprising: using at least one processor to estimate the kerogen porosity using nuclear magnetic resonance (NMR) signals indicative of an inorganic porosity and NMR signals indicative of a total porosity acquired in a borehole penetrating the earth formation.

Another embodiment according to the present disclosure includes an An apparatus configured to estimate a kerogen porosity of an earth formation, comprising: a nuclear magnetic resonance (NMR) tool configured to be conveyed in a borehole and configured to acquire NMR signals indicative of an inorganic porosity and NMR signals indicative of a total porosity; and at least one processor configured to: estimate the kerogen porosity using the NMR signals indicative of the inorganic porosity and NMR signals indicative of the total porosity.

Another embodiment according to the present disclosure includes a non-transitory computer-readable medium product having stored thereon instructions that, when executed by at least one processor, cause the at least one processor to perform a method, the method comprising: estimating the kerogen porosity using a difference between nuclear magnetic resonance signals indicative of an inorganic porosity and nuclear magnetic resonance signals indicative of a total porosity.

Examples of the more important features of the disclosure have been summarized rather broadly in order that the detailed description thereof that follows may be better understood and in order that the contributions they represent to the art may be appreciated.

BRIEF DESCRIPTION OF THE DRAWINGS

The present disclosure is best understood with reference to the accompanying figures in which like numerals refer to like elements and in which.

DETAILED DESCRIPTION OF THE DISCLOSURE

Figure 1:
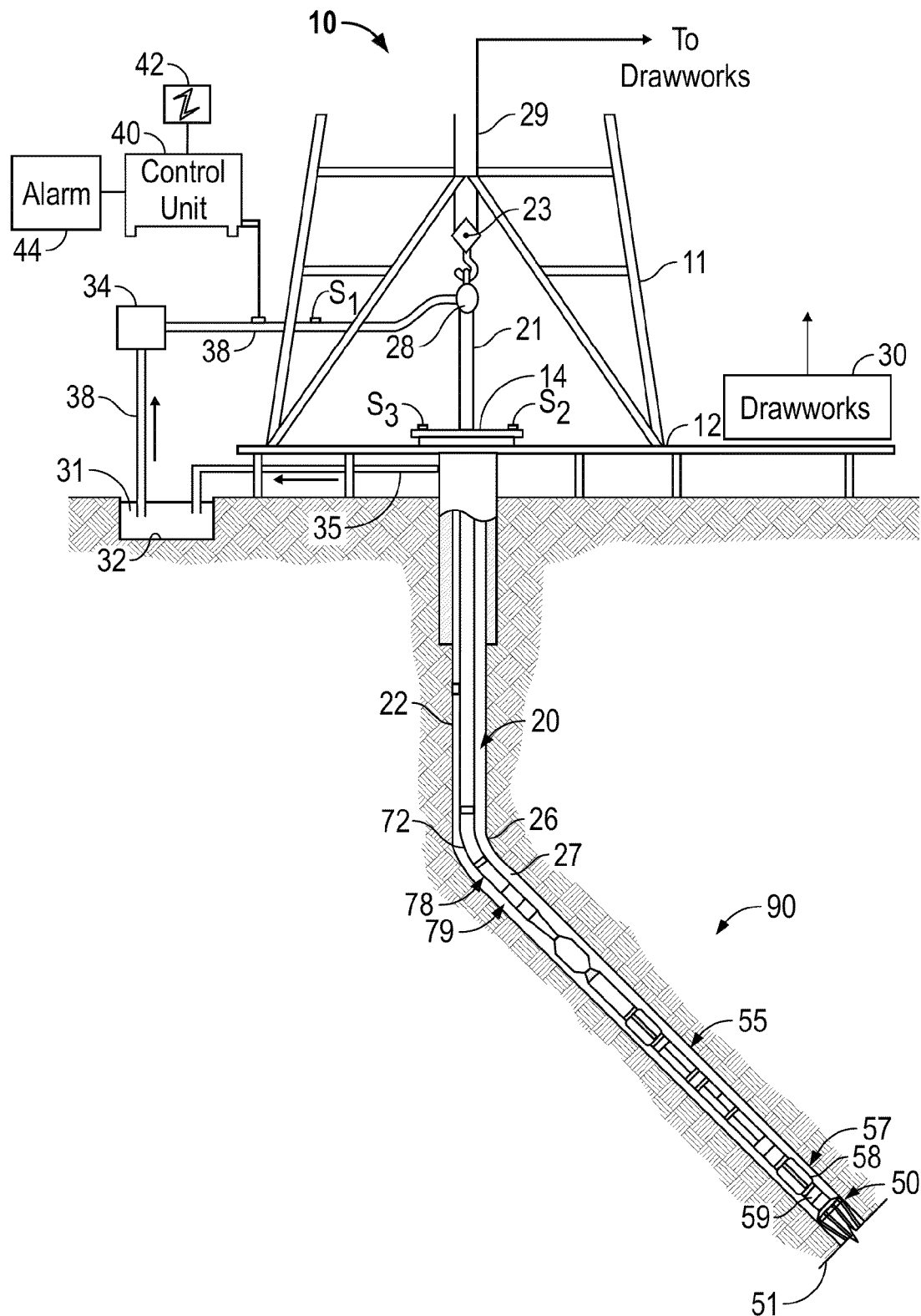
FIG. 1 shows an MWD tool for use with one embodiment of the present disclosure.

The NMR response in a source rock can be represented as $$M=M^{io}+M^{org} \quad (3)$$

where M stands for the measured value of an arbitrary echo in the time-domain NMR acquisition. This is the total NMR signal, which is the sum of all signals due to all fluids within the rock. $M^{io}$ comprises the response from fluids in inorganic, water wet pores, and $M^{org}$ comprises the response due to kerogen porosity.

If the inorganic pore contents can be inferred from mineralogy, resistivity and other logs, the NMR signature due to intrakerogen porosity can be obtained as follows:

$$M^{org}=M-M^{io} \quad (4)$$

The contents of inorganic porosity may be further subdivided into clay-bound water, capillary-bound and movable water as well as free hydrocarbons:

$$M^{io}=M_W^{io}+M_{HC}^{io}=M_{CBW}^{io}+M_{BVI}^{io}+M_{BVMW}^{io}+M_{HC}^{io} \quad (5)$$

where $M_W^{io}$ is the NMR response due to water in inorganic pores, $M_H^{io}$ is the NMR response due to hydrocarbons in inorganic pores, $M_{CBW}^{io}$ is the NMR response due to clay-bound water in inorganic pores, $M_{BVI}^{io}$ is the NMR response due to bound volume irreducible water in inorganic pores, and $M_{BVMW}^{io}$ is the NMR response due to bound volume movable water in inorganic pores.

Also, the NMR response from organic pore contents is exclusively due to hydrocarbons:

$$M^{org}=M_{HC}^{org} \quad (6)$$

The NMR signatures of clays have been investigated by several authors. For example, Prammer et al. (1996) presented NMR amplitudes and T2 relaxation times of montmorillonite, illite, kaolinite and chlorite samples. Essentially, if clay hydration conditions and mineralogic composition are established, it is straightforward to obtain the NMR clay-bound water signature $M_{CBW}^{io}$. In practice, a set of laboratory NMR and X-Ray Diffraction (XRD) measurements may be performed on samples from nearby inorganic intervals whose clay mineralogy is similar to that of the zone of interest. If no core data are present, a similar calibration procedure may be performed using NMR clay-bound water and clay content from geochemical logs.

The total amount of water may be estimated from resistivity measurements using Archie or appropriate shaly sand models known to those of skill in the art. The difference between the total water and clay-bound water may yield the effective water-filled porosity. Since water production from source rocks is rare, the effective water porosity may be considered to be capillary bound and to have relatively short $T_2$ relaxation times (not exceeding few tens of milliseconds). The estimated $T_2$ signature of effective water porosity can be refined by thin section analysis of detrital pore sizes and XRD mineralogy for surface relaxivities, performed on core samples from the zone of interest. In the absence of core data, Pickett-plot analysis within inorganic intervals may be used to quantify the amount of total water.

Light hydrocarbons in the water-wet pores typically have large $T_1$ and/or $T_2$ contrast from all other fluids. Modern NMR fluid typing methods based on diffusivity or $T_1/T_2$ analysis can directly quantify their NMR response $M_{HC}^{io}$.

An initial NMR tool response may require one or more correction before arriving at information indicative of the desired parameter of interest. Illustrative embodiments of the present claimed subject matter are described in detail below.

FIG. 1 shows a schematic diagram of a drilling system 10 with a drillstring 20 carrying a drilling assembly 90 (also referred to as the bottomhole assembly, or "BHA") conveyed in a "wellbore" or "borehole" 26 for drilling the borehole. The drilling system 10 includes a conventional derrick 11 erected on a floor 12 which supports a rotary table 14 that is rotated by a prime mover such as an electric motor (not shown) at a desired rotational speed. The drillstring 20 includes a tubing, such as a drill pipe 22 or a coiled-tubing extending downward from the surface into the borehole 26. The drillstring 20 is pushed into the borehole 26 when a drill pipe 22 is used as the tubing. For coiled-tubing applications, a tubing injector, such as an injector (not shown), however, is used to move the tubing from a source thereof, such as a reel (not shown), to the borehole 26. The drill bit 50 attached to the end of the drillstring breaks up the geological formations when it is rotated to drill the borehole 26. If a drill pipe 22 is used, the drillstring 20 is coupled to a drawworks 30 via a Kelly joint 21, swivel 28, and line 29 through a pulley 23. During drilling operations, the drawworks 30 is operated to control the weight on bit, which is an important parameter that affects the rate of penetration. The operation of the drawworks is well known in the art and is thus not described in detail herein. For the purposes of this disclosure, it is necessary to know the axial velocity (rate of penetration or ROP) of the bottomhole assembly. Depth information and ROP may be communicated downhole from a surface location. Alternatively, the method disclosed in U.S. Pat. No. 6,769,497 to Dubinsky et al. having the same assignee as the present application and the contents of which are incorporated herein by reference may be used. The method of Dubinsky uses axial accelerometers to determine the ROP. During drilling operations, a suitable drilling fluid 31 from a mud pit (source) 32 is circulated under pressure through a channel in the drillstring 20 by a mud pump 34. The drilling fluid passes from the mud pump 34 into the drillstring 20 via a desurger (not shown), fluid line 38 and Kelly joint 21. The drilling fluid 31 is discharged at the borehole bottom 51 through an opening in the drill bit 50. The drilling fluid 31 circulates uphole through the annular space 27 between the drillstring 20 and the borehole 26 and returns to the mud pit 32 via a return line 35. The drilling fluid acts to lubricate the drill bit 50 and to carry borehole cutting or chips away from the drill bit 50. A sensor $S_1$ typically placed in the line 38 provides information about the fluid flow rate. A surface torque sensor $S_2$ and a sensor $S_3$ associated with the drillstring 20 respectively provide information about the torque and rotational speed of the drillstring. Additionally, a sensor (not shown) associated with line 29 is used to provide the hook load of the drillstring 20.

In one embodiment of the disclosure, the drill bit 50 is rotated by only rotating the drill pipe 22. In another embodiment of the disclosure, a downhole motor 55 (mud motor) is disposed in the drilling assembly 90 to rotate the drill bit 50 and the drill pipe 22 is rotated usually to supplement the rotational power, if required, and to effect changes in the drilling direction.

In an exemplary embodiment of FIG. 1, the mud motor 55 is coupled to the drill bit 50 via a drive shaft (not shown) disposed in a bearing assembly 57. The mud motor rotates the drill bit 50 when the drilling fluid 31 passes through the mud motor 55 under pressure. The bearing assembly 57 supports the radial and axial forces of the drill bit. A stabilizer 58 coupled to the bearing assembly 57 acts as a centralizer for the lowermost portion of the mud motor assembly.

In one embodiment of the disclosure, a drilling sensor module 59 is placed near the drill bit 50. The drilling sensor module contains sensors, circuitry and processing software and algorithms relating to the dynamic drilling parameters. Such parameters typically include bit bounce, stick-slip of the drilling assembly, backward rotation, torque, shocks, borehole and annulus pressure, acceleration measurements and other measurements of the drill bit condition. A suitable telemetry or communication sub 72 using, for example, two-way telemetry, is also provided as illustrated in the drilling assembly 90. The drilling sensor module processes the sensor information and transmits it to the surface control unit 40 via the telemetry system 72.

The communication sub 72, a power unit 78 and an MWD tool 79 are all connected in tandem with the drillstring 20. Flex subs, for example, are used in connecting the MWD tool 79 in the drilling assembly 90. Such subs and tools form the bottom hole drilling assembly 90 between the drillstring 20 and the drill bit 50. The drilling assembly 90 makes various measurements including the pulsed nuclear magnetic resonance measurements while the borehole 26 is being drilled. The communication sub 72 obtains the signals and measurements and transfers the signals, using two-way telemetry, for example, to be processed on the surface. Alternatively, the signals can be processed using a downhole processor in the drilling assembly 90.

The surface control unit or processor 40 also receives signals from other downhole sensors and devices and signals from sensors $S_1$-$S_3$ and other sensors used in the system 10 and processes such signals according to programmed instructions provided to the surface control unit 40. The surface control unit 40 displays desired drilling parameters and other information on a display/monitor 42 utilized by an operator to control the drilling operations. The surface control unit 40 typically includes a computer or a microprocessor-based processing system, memory for storing programs or models and data, a recorder for recording data, and other peripherals. The control unit 40 is typically adapted to activate alarms 44 when certain unsafe or undesirable operating conditions occur.

A suitable device for use of the present disclosure is disclosed in U.S. Pat. No. 6,215,304 to Slade, the contents of which are fully incorporated herein by reference. It should be noted that the device taught by Slade is for exemplary purposes only, and the method of the present disclosure may be used with many other NMR logging devices, and may be used for wireline as well as MWD applications.

It should be noted that underbalanced drilling is commonly carried out using a coiled tubing instead of a drillstring.

Hence the disclosure of the BHA being conveyed on a drillstring is not to be construed as a limitation. For the purposes of the present disclosure, the term "drilling tubular" is intended to include both a drillstring as well as coiled tubing.

Figure 2:
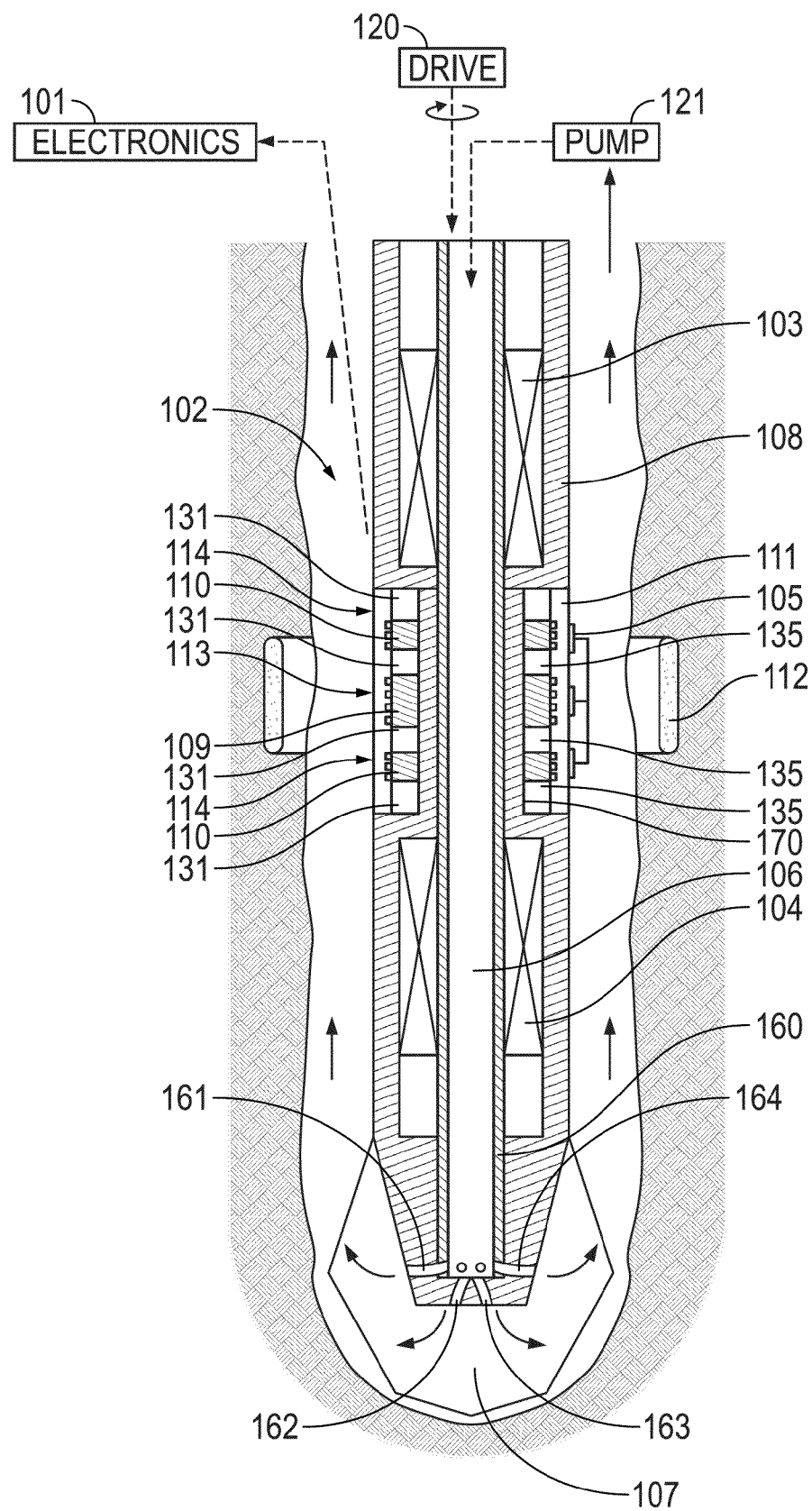
FIG. 2 shows a sensor section of an MWD tool suitable for use with the present disclosure.

Referring now to FIG. 2, the tool has a drill bit 107 at one end, a sensor section 102 behind the drill head, and electronics 101. The sensor section 102 comprises a magnetic field generating assembly for generating a $B_0$ magnetic field (which is substantially time invariant over the duration of a measurement), and an RF system for transmitting and receiving RF magnetic pulses and echoes. The magnetic field generating assembly comprises a pair of axially spaced main magnets 103, 104 having opposed pole orientations (i.e. with like magnetic poles facing each other), and three ferrite members 109, 110 axially arranged between the magnets 103, 104. The ferrite members are made of "soft" ferrite which can be distinguished over "hard" ferrite by the shape of the BH curve which affects both intrinsic coercivity ($H_j$ the intersection with the H axis) and initial permeability ($\mu_i$, the gradient of the BH curve in the unmagnetized case). Soft ferrite $\mu_i$ values typically range from 10 to 10000 whereas hard ferrite has $\mu_i$, of about 1. Therefore the soft ferrite has large initial permeability (typically greater than 10, preferably greater than 1000). The RF system comprises a set of RF transmit antenna and RF receive antenna coil windings 105 arranged as a central "field forming" solenoid group 113 and a pair of outer "coupling control" solenoid groups 114.

The tool has a mud pipe 160 with a clear central bore 106 and a number of exit apertures 161-164 to carry drilling mud to the bit 107, and the main body of the tool is provided by a drill collar 108. Drilling mud is pumped down the mud pipe 160 by a pump 121 returning around the tool and the entire tool is rotated by a drive 120. Coiled tubing or a drillstring may be used for coupling the drive to the downhole assembly.

The drill collar 108 provides a recess 170 for RF transmit antenna and RF receive antenna coil windings 105. Gaps in the pockets between the soft ferrite members are filled with non-conducting material 131, 135 (e.g.: ceramic or high temperature plastic) and the RF coils 113, 114 are then wound over the soft ferrite members 109, 110. The soft ferrites 109, 110 and RF coil assembly 113, 114 are pressure impregnated with suitable high temperature, low viscosity epoxy resin (not shown) to harden the system against the effects of vibration, seal against drilling fluid at well pressure, and reduce the possibility of magnetoacoustic oscillations. The RF coils 113, 114 are then covered with wear plates 111 typically ceramic or other durable non-conducting material to protect them from the rock chippings flowing upwards past the tool in the borehole mud.

Because of the opposed magnet configuration, the device of Slade has an axisymmetric magnetic field and region of investigation 112 that is unaffected by tool rotation. Use of the ferrite results in a region of investigation that is close to the borehole. This is not a major problem on a MWD tool (except for special situations discussed below that are the focus of this disclosure) because there is little invasion of the formation by borehole drilling fluids prior to the logging. The region of investigation is within a shell with a radial thickness of about 20 mm and an axial length of about 50 mm. The gradient within the region of investigation is less than 2.7 G/cm. It is to be noted that these values are for the Slade device and, as noted above, the method of the present disclosure may also be used with other suitable NMR devices. This field gradient of less than 2.7 G/cm may be considered to be a "near zero" field gradient for the purposes of the present disclosure as discussed below.

Two magnetic fields may be used to conduct a typical NMR measurement: a static magnetic field $B_o$ and an alternating magnetic field $B_1$ having a component orthogonal to $B_o$. Pulsed NMR is used in which the alternating field $B_1$ is applied into the sample as a sequence of bursts (usually called pulses):

$$TW-TP-\tau_1-(RP-\tau_2-\text{echo}-\tau_2)_n$$

wherein TW is a (long) wait time of usually several times the spin lattice relaxation time, TP is a tipping pulse for tipping the nuclear spins at an angle substantially equal to ninety degrees to cause precession thereof, $\tau_1$, $\tau_2$ are waiting times, RP is a refocusing pulse for tipping the nuclear spins greater than 90° and n is the number of echoes to be acquired in one sequence. The duration of the events between the echoes is called the interecho time TE. The echoes manifest themselves as rotating macroscopic magnetizations and can be detected with a receiver coil. The induced voltages/currents in this coil are the desired NMR signals. In order to obtain NMR signals and refocus them correctly, it is important to adhere to NMR resonance conditions, i.e. $B_0$ and $B_1$ amplitudes as well as pulse phases and shapes need to be chosen correctly as known to people familiar with the art of NMR. An exemplary optimized echo sequence called ORPS is discussed, for example, in Hawkes '013. In the ORPS sequence, the tipping pulse is typically 90°, but the refocusing pulses are less than 180°. This is in contrast to the CPMG sequence in which the refocusing pulses are 180° pulses.

Generally, the geometry of the NMR measurement device gives rise to a volume in the earth formation where the $B_0$ field has the correct strength to fulfill a resonance condition and in which an RF field can be presented with a substantial strength and orientation to reorient nuclear spins within the volume. This volume is often referred to as the sensitive volume. For a tool in motion, as the tool moves axially, the volume containing those protons excited by the excitation pulse (first pulse of the echo sequence) moves away from the sensitive volume. Hence, the number of spins available to contribute to the subsequent NMR signal is reduced with each subsequent echo. As a consequence, those echoes obtained later in an echo sequence with axial tool motion appear small compared to those echoes obtained later in an echo sequence acquired with no tool motion. "Later echoes" does not mean that only the last echoes of a sequence are affected. In fact, the loss of signal starts right at the beginning of a sequence and develops over time in a unique pattern. This phenomenon is called outflow.

In general, NMR echo sequences are repeated several times for the purpose of increasing the final signal-to-noise ratio. Even without concern over signal-to-noise ratio, an echo sequence is usually repeated at least once in order to form a phase-alternated pair (PAP) for the purpose of removing offset and ringing effects.

At the end of a sequence obtained with axial tool motion, the magnetization of the sensitive volume is substantially zero. A wait time TW during which re-magnetization of the formation occurs is used as part of the sequence of pulses. Choosing a wait time of at least 5 times the longest $T_1$ of the formation ensures that the formation is fully magnetized (>99% magnetization) immediately prior to the excitation pulse of the ensuing sequence. However, shorter wait times are often chosen in order to achieve a higher NMR data rate, leading to an improved axial resolution or signal-to-noise ratio. The drawback of shortening TW is that the formation may not be fully magnetized immediately prior to the ensuing sequence. As a consequence, the total porosity that is measured in a tool having axial motion can be too low, and the measured $T_2$-distribution is generally distorted, mainly for the longer $T_2$ components.

Similar considerations are present in the radial direction due to radial fluid flow into the borehole. A result of the radial inflow of fluid is an outflow of polarized nuclei from the region of examination, as for the case of vertical tool movement discussed above. By reducing the field gradient, the "outflow effect" can be reduced. In the present disclosure, the tool is designed in such a way as to maintain close to a zero static field gradient in the radial direction, thus minimizing radial motion effects in the NMR signal. In addition to the outflow effect, motion causes a distortion of the phases of the NMR signals, which also reduces the amplitude of the received NMR signal. The phase distortion can be reduced by reducing the static magnetic field gradient but also by reducing the interecho time TE.

A similar solution can be used for a different problem, that of making NMR measurements in small boreholes. A BHA designed for use in a small borehole is limited to a small magnet size, so that a normal tool would have a small region of investigation. With small sensitive regions it is difficult to achieve a sufficient signal to noise ratio, which is required to have a high accuracy of the measurement combined with a good vertical resolution. In addition to or instead of expanding the radial extent of the zone of near zero field gradient, one embodiment of the disclosure combines multiple resonance areas to one big sensitive region, where the measurement is carried out. This combination can be done by designing one common antenna covering all areas.

Figure 3:
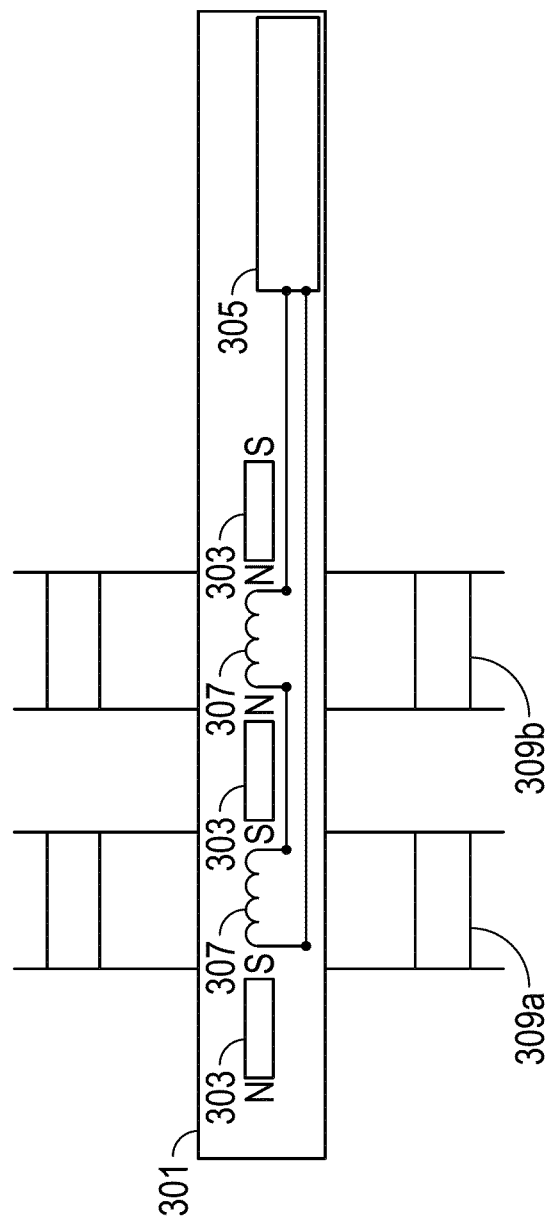
FIG. 3 shows an NMR sensor having multiple regions of examination.

FIG. 3 shows an exemplary logging tool 301. Three magnets 303 are shown. Adjacent magnets have like poles facing each other so as to define two regions of examination 309a, 309b. Antennas 307 are used for generating the RF pulses and measuring the spin echo signals. The electronics module 305 that includes a processor is used for processing the signals received by the antennas. In the configuration shown, the signals from the two antennas are summed, so that effectively, signals from a region of examination that is a combination of 309a and 309b are obtained. This increases the signal to noise ratio, but also reduces the vertical resolution of the NMR measurements. For the purposes of the present disclosure, the BHA may be considered to be a "carrier" and the magnet assembly produces a static magnetic field in one or more regions of examination. The static field gradient in the region of examination is nearly zero, so that during the length of the pulse sequence given by eqn. (1), the "outflow" effect is small and signals are obtained from nuclear spins that have been polarized. Another factor to be considered is that the outflow during the time TE should also be small, so that the spin echo signals are without phase distortion.

It is to be noted that the example given in FIG. 3 is directed towards the problem of obtaining an adequate signal in a small borehole. Basically the same design with a single region of examination can be used to address the problem of fluid inflow by selecting the combination of field gradient, and echo train length to satisfy the outflow condition.

In an alternate embodiment of the disclosure, using two independent antennas, the spin echo signals from 309a and 309b are stored separately in the electronics module. Depth determinations may be conveniently made by having synchronized clocks downhole and upholem and measuring the length of the drill string at the surface. When drilling has progressed so that the measurements made in one region of examination (say 309b) are at the same depth as those made earlier in the other region of examination (say 309a), then the data corresponding to the same depth are combined. This method of summing data from the same depth increases the signal to noise ratio without reducing the vertical resolution.

Figure 4:
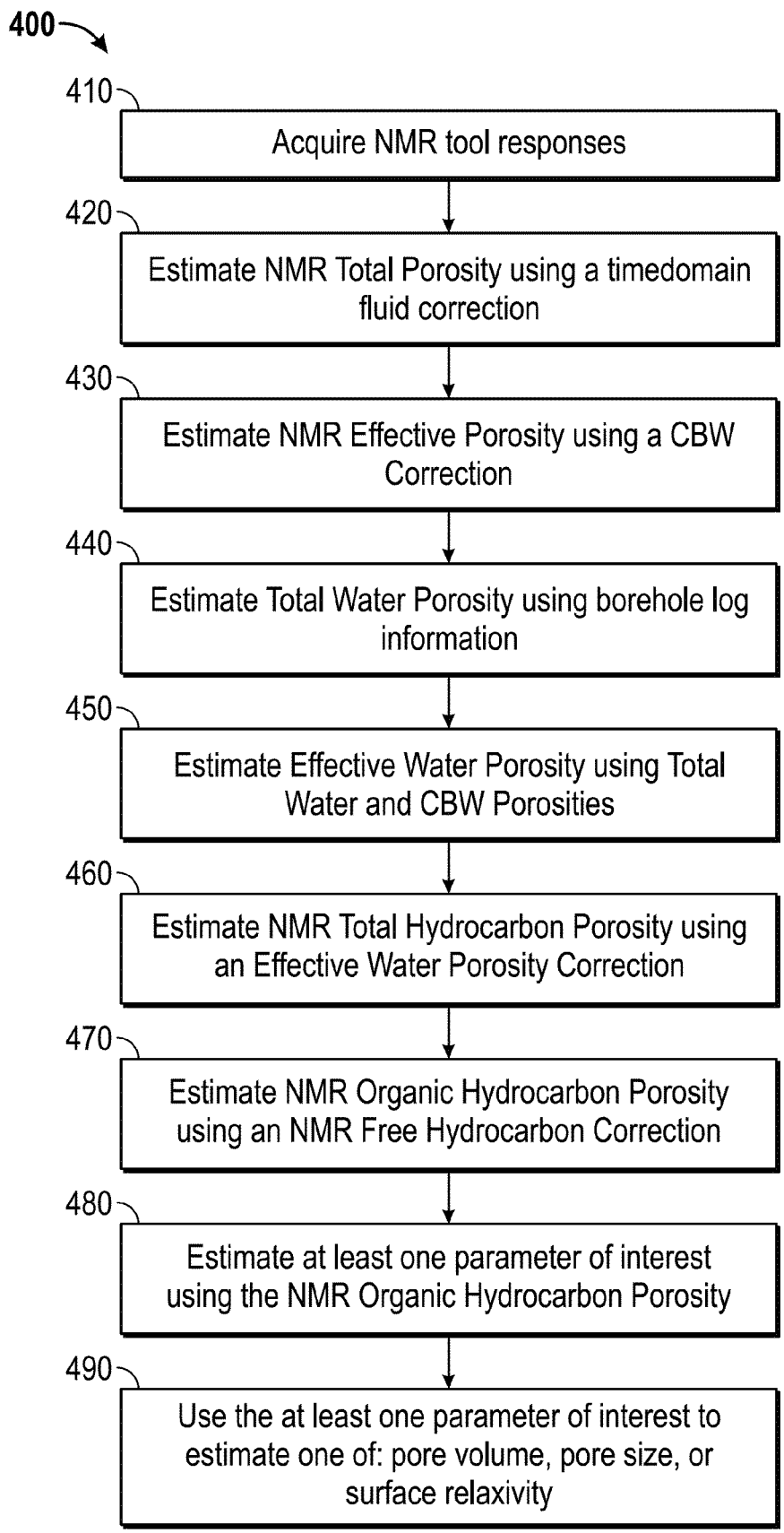
FIG. 4 shows a flow chart of a method according to one embodiment of the present disclosure.

FIG. 4 shows a flow chart of a method 400 according to one embodiment of the present disclosure. In step 410, the logging tool 301 may be used to acquire NMR responses from the earth formation. In step 420, NMR total porosity may be estimated using a time-domain fluid correction. In step 430, NMR effective porosity may be estimated using a clay bound water (CBW) correction. In step 440, a total water porosity may be estimated using borehole log information. In step 450, effective water porosity may be obtained using total water and CBW porosities. In step 460, NMR total hydrocarbon porosity may be estimated using an effective water porosity correction. In step 470, NMR organic hydrocarbon porosity may be estimated using NMR free hydrocarbon correction. In step 480, kerogen porosity of the earth formation may be estimated using the NMR organic hydrocarbon porosity. In step 490, the kerogen porosity may be used to estimate one or more of: (i) a pore volume, (ii) a pore size, and (iii) surface relaxivity. In some embodiments, the step 470 may be performed before any of steps 410-460.

For time-domain fluid correction of step 420, the initial NMR tool response may have the effects of a fluid f removed from the measured NMR data if the following pertinent parameters are available:
a) Volume percent $\phi_f$
b) Intrinsic $T_2$ value or spectrum, $T_{2,i,f}$
c) Diffusivity, $D_f$
d) Ratio of $T_{1,f}$ and intrinsic $T_{2,i,f}$, $R_{i,f} = T_{1,f}/T_{2,i,f}$ Then, $$M_f^{corr}(\phi_f, T_2,i,f,D_f,R_2,i,f,G,TE,TW,n) = M(G,TE,TW,n) - M_f(\phi_f, T_2,i,f,D_f,R_2,i,f,G,TE,TW,n) \quad (7)$$

where, $M_f^{corr}$ is the time-domain corrected NMR response (NMR Total Porosity), G is the magnetic field gradient in Gauss/cm, TW is the wait-time in milliseconds, TE is the echo spacing in milliseconds, and n is the echo index within the echo train. The mathematical expression for a CPMG acquisition is presented as:

$$M_f(\phi_f, T_{2,i,f}, D_f, R_{2,i,f}, G, TE, TW, n) = \left(1 - e^{-\frac{R_{2,i,f} \cdot T_{2,i,f}}{TW}}\right) \cdot e^{\frac{n \cdot TE}{TW}\left(\frac{1}{T_{2,i,f}} + D_f \frac{(\gamma \cdot G \cdot TE)^2}{12}\right)}, \quad (8)$$

where $\gamma = \ldots$ is the proton gyromagnetic ratio. Further, the intrinsic $T_2$ relaxation of any fluid is the superposition of bulk and surface relaxations:

$$\frac{1}{T_{2,i,f}} = \frac{1}{T_{2,b,f}} + \frac{1}{T_{2,s,f}}. \quad (9)$$

The bulk relaxation is governed by the fluid's viscosity and intermolecular interactions and may be calculated theoretically for simple molecules or estimated based on experimental literature. Bulk relaxation occurs to both wetting and nonwetting fluids. The surface relaxation is a function of the surface/volume ratio of the porous media $$\frac{1}{T_{2,s,f}} = \rho \frac{S}{V}, \quad (10)$$

where ρ is the surface relaxivity, which is a function of the rock's magnetic susceptibility and surface microstructure. Surface relaxation occurs only to fluids in direct contact with the pore surface.

The NMR total porosity may be corrected in step 430 for the presence of clay bound water (CBW) using mineralogy information about the earth formation. This CBW correction will result in an estimate of NMR effective porosity. The mineralogy information may include, but is not limited to, one or more of: (i) a geochemical log, (ii) an open hole log, and (iii) a core analysis.

Figure 5:
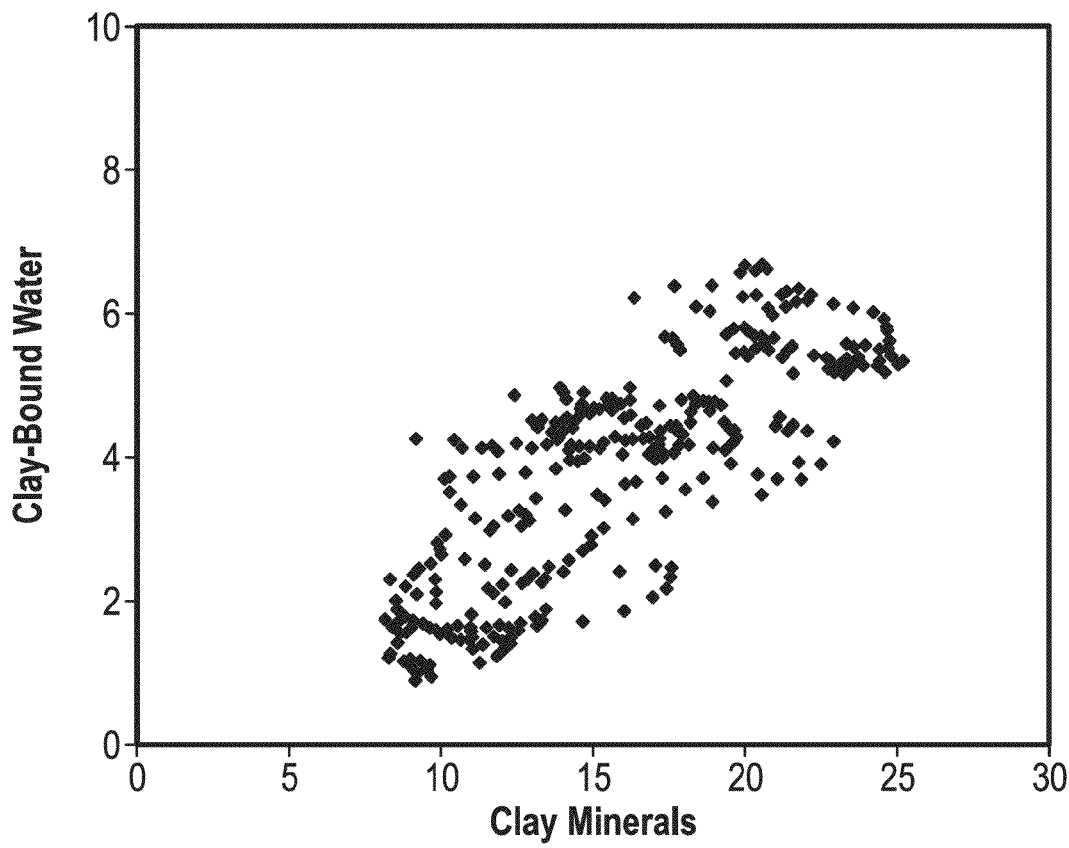
FIG. 5 shows a chart indicating the relationship of NMR clay-bound water and select minerals from a geochemical log.

The NMR signature of different clays has been researched quite extensively. Prammer et al. (1996) determined typical $T_2$ values and NMR visible clay-bound water per gram dry clay as displayed in FIG. 1 for illite, montmorillonite, chlorite and kaolinite. One can notice that $\phi_{CBW}$ and $T_{2,CBW}$ heavily depend upon clay mineralogy and clay hydration. Modern geochemical tools provide detailed clay mineralogy information (Pemper, 2007). Clay hydration is not directly measured but it can be inferred from mineralogy and NMR data from nearby organic-lean intervals. In order to correct for CBW, first the clays may be separated into groups with similar $T_2$ values. In this context "similar" means that their $T_2$ values cannot be distinguished by NMR logging instruments. Then, group sums may be determined from geochemical logs and related with NMR volumes falling into the group's characteristic $T_2$ range. For example, FIG. 5 presents the relationship between NMR clay-bound water (<3.3 ms) and illite+ smectite contents from a geochemical log. Once the non-NMR based CBW is determined, the theoretical signature of the CBW may be subtracted from the from the NMR tool response to yield an estimate of NMR effective porosity.

Figure 6:
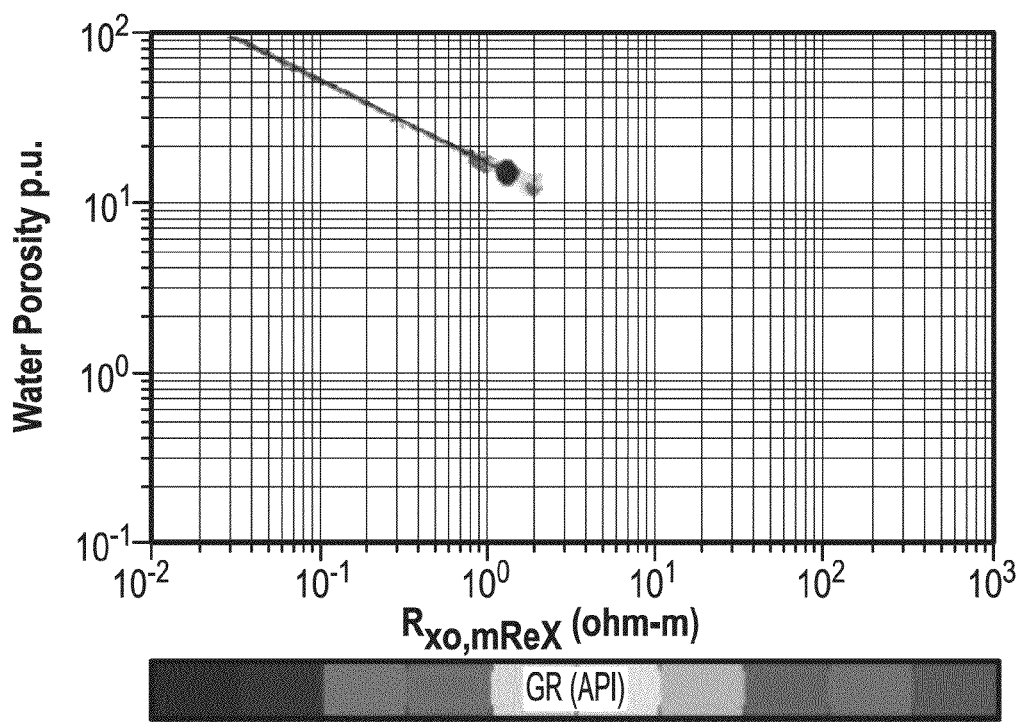
FIG. 6 shows a chart relating water porosity to resistivity.

Total water porosity may be estimated in step 440 using resistivity logs and a shaly or clean resistivity model. Information about water resistivity and other parameters of the chosen model may be used for estimating total water porosity. This information can be obtained from laboratory measurements, analysis of produced water, or combining porosity and resistivity log, such as in Pickett plots as shown in FIG. 6. The result will be a total water porosity log O.

The effective water porosity $\phi_{e,W}$ in step 450 can be obtained as the difference between the total water and clay-bound water porosities:

$$\phi_{e,W} = \phi_W - \phi_{CWB}. \tag{11}$$

The $T_1$ and $T_2$ relaxation times of effective water porosity can be estimated from pore size analysis from thin sections and mineralogy measurements. Pore-scale modeling techniques can provide systematic framework for this approach. Typically, shale gas systems do not have movable water, providing further constraints to the relaxation time estimations. Effective water porosity may be used to estimate the NMR total hydrocarbon porosity in step 460.

At any stage in the overall correction procedure, NMR Free Hydrocarbon correction can be performed. This correction in step 470 is rather straightforward as it does not involve any other logs and all parameters are naturally determined during the fluid-typing procedure.

Advanced NMR interpretation schemes provide standalone NMR hydrocarbon analysis. The underlying assumption is that hydrocarbons are in their bulk state, i.e. their relaxation is governed by bulk and diffusion relaxation. This is still true for hydrocarbons residing in water-wet detrital pores. To have a pure organic-bound hydrocarbon signature, the NMR response of these non-wetting hydrocarbons must be removed:

$$M_f^{corr}(\phi_f,T_2,i,f,D_f,R_2,i,f,G,TE,TW,n) = M(G,TE,TW,n) - M_{HC}(\phi_{HC},T_2,i,HC,D_{HC},R_2,i,HC,G,TE,TW,n) \tag{1}$$

After the corrections have been performed, the end result of the correction procedure is the NMR signature of organic-bound hydrocarbons. This can be converted to a $T_1$ and/or $T_2$ distribution using the same inversion systems used for processing the total NMR signal. The main difference between Free and Organic-Bound Hydrocarbons is that the latter is influenced by surface relaxation in addition to its bulk and diffusion relaxations. Thus, the NMR signature of Organic-Bound Hydrocarbons carries the information indicative of kerogen porosity that may be estimated in step 480.

Figure 7:
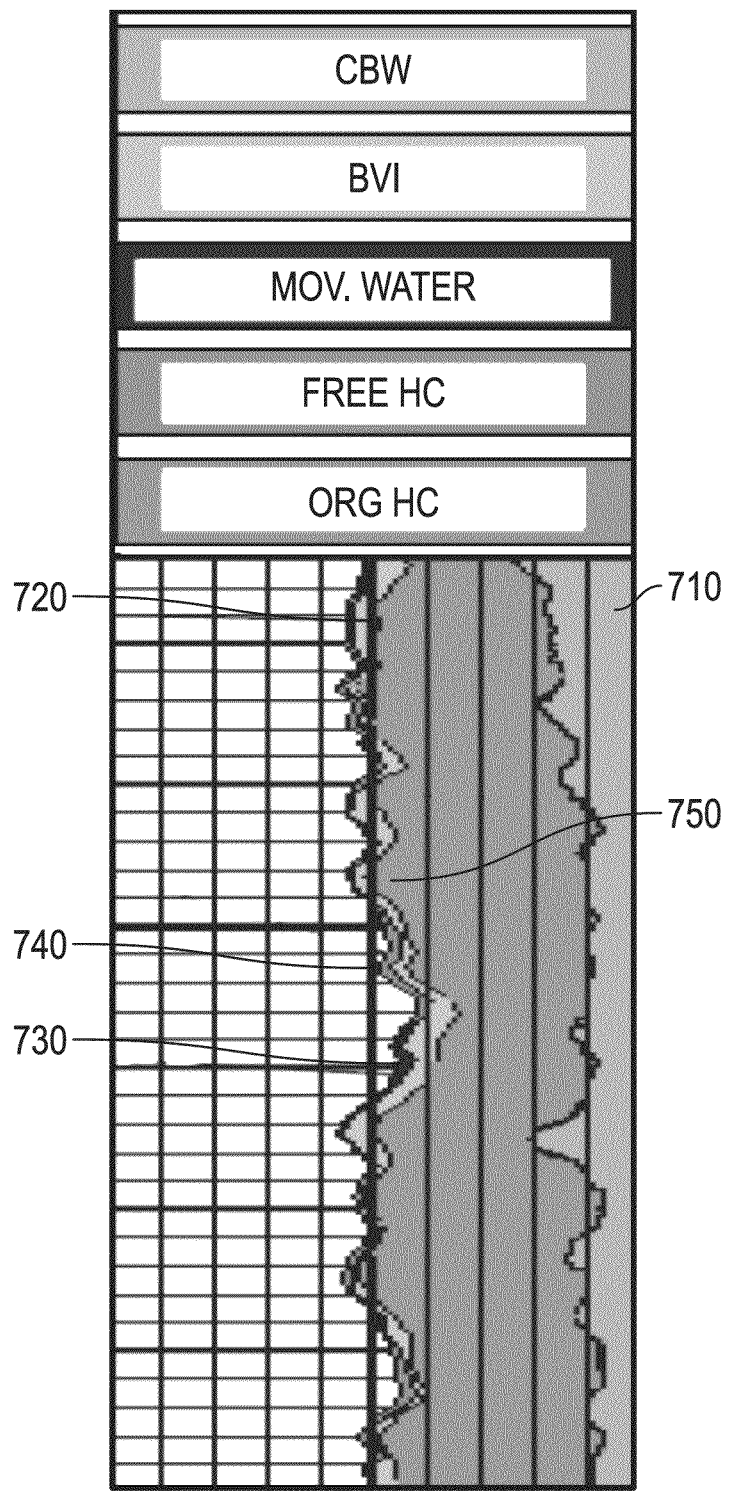
FIG. 7 shows a volumetric analysis chart for a volume of interest of an earth formation.

The Organic-Bound Hydrocarbon (kerogen) Porosity may be obtained as the area under the $T_1$ and/or $T_2$ spectra and can be obtained even without any water or hydrocarbon relaxation properties as long as these volumes are present. Then, a volumetric analysis as shown in FIG. 7 can be obtained. Area 710 represents the volume of CBW. Area 720 represents the volume of Bound Volume Irreducible water. Area 730 represents the volume of movable water. Area 740 represents the volume of free hydrocarbons. Area 750 represents the volume of organic hydrocarbons. In this representation hydrocarbons are subdivided into free (green) and organic-bound (gray).

The $T_1$ and/or $T_2$ distributions of Organic-Bound Hydrocarbons are obtained by applying standard NMR processing techniques on the end product of the correction procedure described in the previous section. Once such a spectrum is available, and diffusion and bulk relaxations are negligible in comparison with the surface relaxation, the relaxation is dominated by the surface effect:

$$\frac{1}{T_{2,org}} = \rho \frac{S}{V}, \tag{2}$$

The surface-to-volume ratio can be estimated from high resolution electron microscopy or gas adsorption porosimetry measurements. Combining this with an NMR measurement on the same sample that is fully saturated with hydrocarbons similar to what is produced we can estimate the pertinent surface relaxivity. Once the surface relaxivity is established, the surface-to-volume ratio of intrakerogen porosity can be directly obtained from the organic-bound hydrocarbon $T_1$ and/or $T_2$ distributions.

The disclosure has been described with reference to a NMR device that is part of a BHA conveyed on a drillstring. The disclosure is equally applicable for NMR devices conveyed on coiled tubing. The processing described herein may be done using a downhole processor and the results stored on a suitable memory downhole or telemetered to the surface. Alternatively, the data may be stored on a downhole memory and processed when the BHA is tripped out of the borehole. With improved telemetry capability, it should be possible to telemeter the NMR measurements to a surface location and do the processing there.

The results of the processing may be used to estimate, using known methods, properties of interest such as a $T_2$ distribution, volumetrics, permeability, bound volume irreducible, effective porosity, bound water, clay-bound water, total porosity, pore size distribution, and other rock and fluid properties that are based on NMR data. These are all used in reservoir evaluation and development.

The processing of the data may be conveniently done on a processor. The processor executes a method using instructions stored on a suitable non-transitory computer-readable medium product. The non-transitory computer-readable medium product may include a ROM, an EPROM, an EAROM, a flash memory, and/or an optical disk.

While the foregoing disclosure is directed to the specific embodiments of the disclosure, various modifications will be apparent to those skilled in the art. It is intended that all such variations within the scope and spirit of the appended claims be embraced by the foregoing disclosure.

What is claimed is:

1. A method of estimating a kerogen porosity of an earth formation, comprising:
using at least one processor to estimate nuclear magnetic resonance (NMR) signal indicative of an organic bound hydrocarbon including: correcting NMR signals indicative of a total porosity by removing effects attributable to an inorganic porosity from the NMR signals indicative of the total porosity using signals indicative of the inorganic porosity to estimate the effects, wherein the inorganic porosity being due to at least one (i) clay-bound water, (ii) capillary-bound water, (iii) movable water, and (iv) free hydrocarbon, and wherein the NMR signals indicative of the total porosity and the signals indicative of the inorganic porosity being acquire in a borehole penetrating the earth formation; estimating the kerogen porosity using the NMR signals indicative of the organic-bound hydrocarbon; and using the kerogen porosity to perform at least one of (i) evaluating a reservoir, and (ii) developing the reservoir.

2. The method of claim 1, wherein the estimation of the kerogen porosity includes using a difference between the inorganic porosity and the total porosity.

3. The method of claim 1, further comprising:
using the estimated kerogen porosity to estimate at least one of: (i) a pore volume, (ii) a pore size, and (iii) surface relaxivity.

4. The method of claim 1, wherein estimating the kerogen porosity comprises:
correcting the NMR signals indicative of the total porosity using mineralogy information.

5. The method of claim 4, wherein the mineralogy information includes at least one of: (i) a geochemical log, (ii) an open hole log, and (iii) a core analysis.

6. The method of claim 4, wherein the correction includes correcting for at least one of: (i) an NMR tool response, (ii) clay-bound water, (iii) effective water porosity, and (iv) free hydrocarbons.

7. The method of claim 1, further comprising:
acquiring the NMR signals indicative of the total porosity including using an NMR tool in the borehole to produce a static magnetic field in the earth formation and align nuclear spin within the earth formation, altering nuclear spins by producing radio frequency (RF) magnetic pulses as an output of a transmitting antenna on the NMR tool, and using a receiving antenna for receiving the NMR signals indicative of the total porosity.

8. An apparatus configured to estimate a kerogen porosity of an earth formation, comprising:
a nuclear magnetic resonance (NMR) tool configured to be conveyed in a borehole and configured to acquire NMR signals; and
at least one processor configured to:
estimate NMR signals indicative of an organic bound hydrocarbon including correcting NMR signals indicative of a total porosity by removing effects attributable to an inorganic porosity from the NMR signals indicative of the total porosity using signals indicative of the inorganic porosity to estimate the effects, wherein the inorganic porosity being due to at least one (i) clay-bound water, (ii) capillary-bound water, (iii) movable water, and (iv) free hydrocarbon, and wherein the NMR signals indicative of the total porosity and the signals indicative of the inorganic porosity being acquire in a borehole penetrating the earth formation; and estimate the kerogen porosity using the NMR signals indicative of the organic-bound hydrocarbon.

9. The apparatus of claim 8, wherein the at least one processor is further configured to estimate the kerogen porosity by using a difference between the inorganic porosity and the total porosity.

10. The apparatus of claim 8, wherein the at least one processor is further configured to:
use the estimated kerogen porosity to estimate at least one of: (i) a pore volume, (ii) a pore size, and (iii) surface relaxivity.

11. The apparatus of claim 8, wherein the at least one processor is further configured to:
correct the NMR signals indicative of the total porosity using mineralogy information.

12. The apparatus of claim 11, wherein the mineralogy information includes at least one of: (i) a geochemical log, (ii) an open hole log, and (iii) a core analysis.

13. The apparatus of claim 11, wherein the correction includes correcting for at least one of: (i) an NMR tool response, (ii) clay-bound water, (iii) effective water porosity, and (iv) free hydrocarbons.

14. A non-transitory computer-readable medium product having stored thereon instructions that, when executed by at least one processor, cause the at least one processor to perform a method, the method comprising:
using at least one processor to estimate nuclear magnetic resonance (NMR) signal indicative of an organic bound hydrocarbon including: correcting NMR signals indicative of a total porosity by removing effects attributable to an inorganic porosity from the NMR signals indicative of the total porosity using signals indicative of the inorganic porosity to estimate the effects, wherein the inorganic porosity being due to at least one (i) clay-bound water, (ii) capillary-bound water, (iii) movable water, and (iv) free hydrocarbon, and wherein the NMR signals indicative of the total porosity and the signals indicative of the inorganic porosity being acquire in a borehole penetrating the earth formation; estimating the kerogen porosity using the NMR signals indicative of the organic-bound hydrocarbon; and using the kerogen porosity to perform at least one of (i) evaluating a reservoir, and (ii) developing the reservoir.

15. The non-transitory computer-readable medium product of claim 14 further comprising at least one of: (i) a ROM, (ii) an EPROM, (iii) an EEPROM, (iv) a flash memory, and (v) an optical disk.

* * * * *